(12) United States Patent　　(10) Patent No.: US 7,587,516 B2
Bhanot et al.　　(45) Date of Patent: Sep. 8, 2009

(54) CLASS NETWORK ROUTING

(75) Inventors: Gyan Bhanot, Princeton, NJ (US);
Matthias A. Blumrich, Ridgefield, CT (US); Dong Chen, Croton On Hudson, NY (US); Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Burkhard D. Steinmacher-Burow, Mount Kisco, NY (US); Todd E. Takken, Mount Kisco, NY (US); Pavlos M. Vranas, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 934 days.

(21) Appl. No.: 10/468,999

(22) PCT Filed: Feb. 25, 2002

(86) PCT No.: PCT/US02/05573
§ 371 (c)(1),
(2), (4) Date: Aug. 22, 2003

(87) PCT Pub. No.: WO02/069550
PCT Pub. Date: Sep. 6, 2002

(65) Prior Publication Data
US 2004/0081155 A1　Apr. 29, 2004

Related U.S. Application Data

(60) Provisional application No. 60/271,124, filed on Feb. 24, 2001.

(51) Int. Cl.
*G06F 15/173*　(2006.01)
*H04L 12/66*　(2006.01)
*H04L 12/50*　(2006.01)
(52) U.S. Cl. .................. 709/238; 370/352; 370/387; 370/388; 370/389; 370/395.31
(58) Field of Classification Search ......... 709/238–242; 370/352–358, 386–390, 395.31
See application file for complete search history.

(56) References Cited

U.S. PATENT DOCUMENTS 5,151,900 A * 9/1992 Snyder et al. ............... 370/400
(Continued)

OTHER PUBLICATIONS

El-Amawy, et al. "A systolic architecture for fast dense matrix inversion"; Transactions on Computers; Mar. 1989 vol. 38, Issue: 3, On pp. 449-455.*

(Continued)

*Primary Examiner*—Patrice Winder
*Assistant Examiner*—Lin Liu
(74) *Attorney, Agent, or Firm*—Scully, Scott, Murphy & Presser, P.C.; Daniel P. Morris, Esq.

(57) ABSTRACT

Class network routing is implemented in a network such as a computer network comprising a plurality of parallel compute processors at nodes thereof. Class network routing allows a compute processor to broadcast a message to a range (one or more) of other compute processors in the computer network, such as processors in a column or a row. Normally this type of operation requires a separate message to be sent to each processor. With class network routing pursuant to the invention, a single message is sufficient, which generally reduces the total number of messages in the network as well as the latency to do a broadcast. Class network routing is also applied to dense matrix inversion algorithms on distributed memory parallel supercomputers with hardware class function (multicast) capability. This is achieved by exploiting the fact that the communication patterns of dense matrix inversion can be served by hardware class functions, which results in faster execution times.

16 Claims, 4 Drawing Sheets

U.S. PATENT DOCUMENTS

| | | | |
|---|---|---|---|
| 5,331,637 A * | 7/1994 | Francis et al. | 370/408 |
| 6,112,323 A * | 8/2000 | Meizlik et al. | 714/748 |
| 6,230,252 B1 * | 5/2001 | Passint et al. | 712/12 |
| 6,370,145 B1 * | 4/2002 | Dally et al. | 370/400 |
| 6,584,075 B1 * | 6/2003 | Gupta et al. | 370/256 |
| 6,598,145 B1 * | 7/2003 | Dally et al. | 712/1 |
| 6,853,635 B1 * | 2/2005 | Beshai | 370/351 |
| 7,099,323 B1 * | 8/2006 | Doong et al. | 370/390 |

OTHER PUBLICATIONS

Stojčev et al. "An optimal scheduling procedure for matrix inversion on linear array at a processor level"; International Journal of Parallel Programming; vol. 22, No. 4 / Aug. 1994; p. 435-448.*

S. E. Deering; "Multicast routing in internetworks and extended LANs"; Applications, Technologies, Architectures, and Protocols for Computer Communication; pp. 56-64 Year of Publication: 1988.*

Yang et al.; "Performance evaluation of multicast wormhole routing in 2D-torusmulticomputers"; Computing and Information, 1992. Proceedings, ICCI '92., Fourth International Conference on.*

* cited by examiner

CLASS NETWORK ROUTING

CROSS-REFERENCE

The present invention claims the benefit of commonly-owned, co-pending US. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. U.S. patent application Ser. No. 10/468,999, for "Class Networking Routing"; U.S. patent application Ser. No. 10/469,000, for "A Global Tree Network for Computing Structures"; U.S. patent application Ser. No. 10/468,997, for 'Global Interrupt and Barrier Networks"; U.S. patent application Ser. No. 11/868,223, for 'Optimized Scalable Network Switch"; U.S. patent application Ser. No. 10/468,991, for "Arithmetic Functions in Torus and Tree Networks'; U.S. patent application Ser. No. 10/468,992, for 'Data Capture Technique for High Speed Signaling"; U.S. patent application Ser. No. 10/468,995, for 'Managing Coherence Via Put/Get Windows'; U.S. patent application Ser. No. 12/196,796, for "Low Latency Memory Access And Synchronization"; U.S. patent application Ser. No. 10/468,990, for 'Twin-Tailed Fail-Over for Fileservers Maintaining Full Performance in the Presence of Failure"; U.S. patent application Ser. No. 10/468,996, for "Fault Isolation Through No-Overhead Link Level Checksums'; U.S. patent application Ser. No. 10/469,003, for "Ethernet Addressing Via Physical Location for Massively Parallel Systems"; U.S. patent application Ser. No. 10/469,002, for "Fault Tolerance in a Supercomputer Through Dynamic Repartitioning"; U.S. patent application Ser. No. 10/258,515, for "Checkpointing Filesystem"; U.S. patent application Ser. No. 10/468,998, for "Efficient Implementation of Multidimensional Fast Fourier Transform on a Distributed-Memory Parallel Multi-Node Computer"; U.S. patent application Ser. No. 10/468,993, for "A Novel Massively Parallel Supercomputer"; and U.S. patent application Ser. No. 10/083,270, for "Smart Fan Modules and System".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

The present invention relates generally to a class network routing, and more particularly pertains to class network routing which implements class routing in a network such as a computer network comprising a plurality of parallel compute processors at nodes thereof, and which allows a compute processor to broadcast a message to one or more other compute processors in the computer network, such as processors in a column or a row. Normally this type of operation requires a separate message to be sent to each processor. With class network routing pursuant to the invention, a single message is sufficient, which generally reduces the total number of messages in the network as well as the latency to do a multicast.

The present invention relates to the field of message-passing data networks, for example, a network as used in a distributed-memory message-passing, parallel computer, as applied for example to computation in the field of life sciences.

The present invention also uses the class function on a torus computer network to do dense matrix calculations. By using the hardware implemented class function on the torus computer network it is possible to do high performance dense matrix calculations.

The present invention also relates to the field of distributed-memory, message-passing parallel computer design and system software, as applied for example to computation in the field of life sciences. More specifically it relates to the field of high performance linear algebra software for distributed memory parallel supercomputers.

2. Discussion of the Prior Art

A large class of important computations can be performed by massively parallel computer systems. Such systems consist of many compute nodes, each of which typically consist of one or more CPUs, memory, and one or more network interfaces to connect it with other nodes.

The computer described in related U.S. provisional application Ser. No. 60/271,124, filed Feb. 24, 2001, for A Massively Parallel Supercomputer, leverages system-on-a-chip (SOC) technology to create a scalable cost-efficient computing system with high throughput. SOC technology has made it feasible to build an entire multiprocessor node on a single chip using libraries of embedded components, including CPU cores with integrated, first-level caches. Such packaging greatly reduces the components count of a node, allowing for the creation of a reliable, large-scale machine.

A message-passing data network serves to pass messages between nodes of a network, each of which can perform local operations independently of other nodes. Nodes can act in concert by passing messages between them over the network. An example of such a network is a distributed-memory parallel computer wherein each of its nodes has one or more processors that operate on local memory. An application using multiple nodes of such a computer coordinates the actions of the multiple nodes by passing messages between them. The words switch and router are used interchangeably throughout this specification.

A message-passing data network consists of switches and links, wherein a link merely passes data between two switches. A switch routes incoming data from a node or link to another node or link. A switch may be connected to an arbitrary number of nodes and links. Depending on their location in the network, a message between two nodes may need to traverse several switches and links.

Prior art networks efficiently support some types of message passing, but not all types. For example, some networks efficiently support unicast message passing to a single receiving node, but not multicast message passing to an arbitrary number of receiving nodes. Efficient support of multicast message passing is required in various situations, such as numerical algorithms executed on a distributed-memory parallel computer, which is a requirement in the applications disclosed herein for dense matrice inversion using class functions.

Many user applications need to invert very large N by N (N×N) dense matrices, where N is greater than several thousand. Dense matrices are matrices that have most of their entries being non-zero. Typically, inversion of such matrices can only be done using large distributed memory parallel supercomputers. Algorithms that perform dense matrix inversions are well known and can be generalized for use in distributed memory parallel supercomputers. In that case a large amount of inter-processor communication is required. This can slow down the application considerably.

SUMMARY OF THE INVENTION

Accordingly, it is a primary object of the present invention to provide class network routing which implements class routing in a network which allows a compute processor to broadcast a message to a range of processors, such as processors in a column or a row. Normally this type of operation requires a separate message to be sent to each processor. With class routing pursuant to the present invention, a single message is sufficient, which generally reduces the total number of messages in the network as well as the latency to do a broadcast. The class network routing enhances a network such that it more efficiently supports some additional types of message passing.

Class routing enhances a network to more efficiently support additional types of message passing. As usual, a message is divided into one or more packets which pass atomically through the network. Class routing adds a class value to each packet. At each switch, the class value is used as an index to one or more tables, whose stored values determine the actions performed by the switch on the packet. An index-based table-lookup is fast and efficient, as required for maximal throughput and minimal latency across a switch.

Class routing can be summarized as an efficient encoding and decoding of information needed by a switch to act on a packet, to enable the network to provide certain types of message passing. The information is encoded in the class value of the packet and in the tables of the switches. The information is decoded by using the class value of a packet as an index to the tables.

A network without class routing is referred to as a basic network. With class routing, it is an enhanced network. With the appropriate entries in the class tables of all the switches, one or more classes of the enhanced network can provide the message-passing types of the basic network. Moreover, since using the class value of a packet as an index to a table is fast, the message-passing types of the basic network are not appreciably slowed down by the enhancement when compared with the basic network.

Other entries in the class tables can provide message-passing types beyond those of the basic network. For example, the unicast message passing of a basic network can be enhanced by class routing to path-based multidrop message passing for multiphase multicasting.

In the classes described above, the enhanced network provides the message-passing types of the basic network, either unmodified or enhanced. In addition, some classes of the enhanced network could override the basic network. For example, overriding classes can provide multidestination. message passing for single-phase multicasting. If class routing provides the only message-passing types, then no underlying basic network is required.

The present invention makes dense matrix inversion algorithms on distributed memory parallel supercomputers with hardware class function capability perform faster. A hardware class function is a particular use of class routing. This is achieved by exploiting the fact that the communication patterns of dense matrix inversion can be served by hardware class functions. This results in faster execution times.

If the parallel supercomputer possesses class function capability at the hardware level, then the particular communication patterns of dense matrix inversion can be exploited by using class functions in order to minimize the communication delay. For example, provisional application Ser. No. 60/271,124 describes a computer with function capability at the hardware level.

BRIEF DESCRIPTION OF THE DRAWINGS

The foregoing objects and advantages of the present invention for a class network routing may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The distributed-memory parallel supercomputer described in U.S. provisional application Ser. No. 60/271,124 comprises a plurality of nodes. Each of the nodes includes at least one processor, which operates on a local memory. The nodes are interconnected as a multidimensional grid and they communicate via grid links. Without losing generality and in order to make the description of this invention easily understandable to one skilled in the art, the multidimensional node grid will be described as an exemplary 2-dimensional grid or an exemplary 3-dimensional grid. The 3-dimensional grid is implemented by a Torus-based architecture. Notwithstanding the fact that only the 2-dimensional node grids or 3-dimensional. node grids are described in the following description, it is contemplated within the scope of the present invention that grids of other dimensions may easily be provided based on the teachings of the present invention. An example of 3 dimensions is the 3-dimensional grid implemented on the Torus-based architecture described in provisional application Ser. No. 60/271,124.

Figure 1:
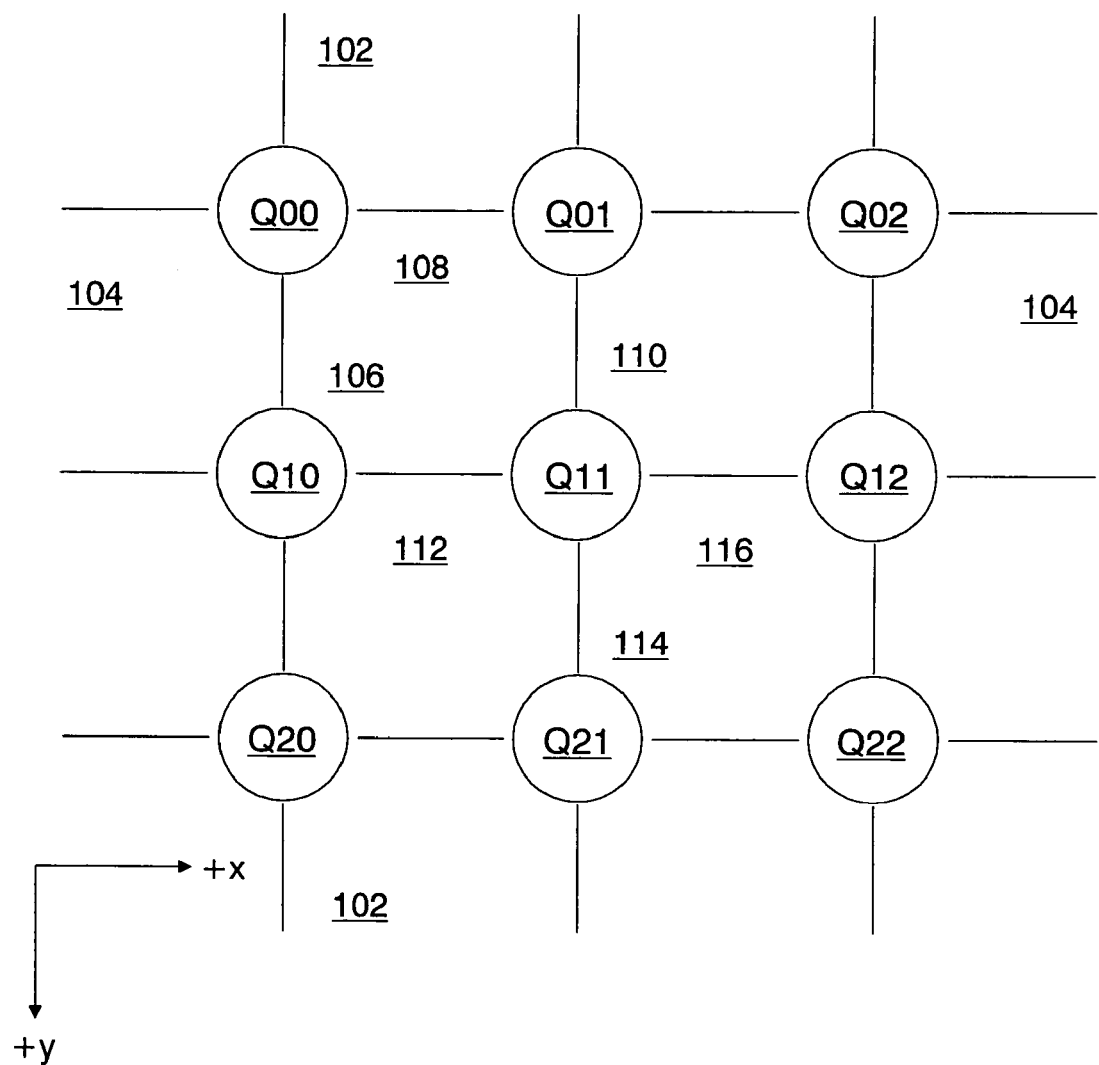
FIG. 1 illustrates an exemplary distributed-memory parallel supercomputer that includes 9 nodes interconnected via a multidimensional grid utilizing a 2-dimensional 3×3 Torus-network according to the present invention.

FIG. 1 is an exemplary illustration of a distributed-memory parallel supercomputer that includes 9 nodes interconnected via a multidimensional grid utilizing a 2-dimensional 3×3 Torus network 100. It is noted that the number of nodes is in exemplary fashion limited to 9 nodes for brevity and clarity, and that the number of nodes may significantly vary depending on a particular architectural requirements for the distributed-memory parallel supercomputer. FIG. 1 depicts 9 nodes labeled as Q00-Q22, a pair of which is interconnected by a grid link. In total, the 9-node Torus network 100 is interconnected by 18 grid links, where each node is directly interconnected to four other nodes in the Torus network 100 via a respective grid link. It is noted that unlike a mesh, the exemplary 2-dimensional Torus network 100 includes no edge nodes. For example, node Q00 is interconnected to node Q20 via grid link 102; to node Q02 via grid link 104; to node Q10 via grid link 106; and finally to node Q01 via grid link 108. As another example, Node Q11 is interconnected to Node Q01 via grid link 110; to node Q10 via grid link 112; to node Q21 via grid link 114 and finally to Node Q12 via grid link 116. Other nodes are interconnected in a similar fashion.

Data communicated between nodes is transported on the network in one or more packets. For any given communication, more than one packet is needed if the amount of data exceeds the packet-size supported by the network. A packet consists of a packet header followed by the data carried by the packet. The packet header contains information required by the torus network to transport the packet from the source node of the packet to the destination node. In a distributed-memory parallel supercomputer, that is implemented by the assignee of the present patent application, each node on the network is identified by a logical address and the packet header includes a destination address so that the packet is automatically routed to a node on the network as identified by a destination.

Figure 2:
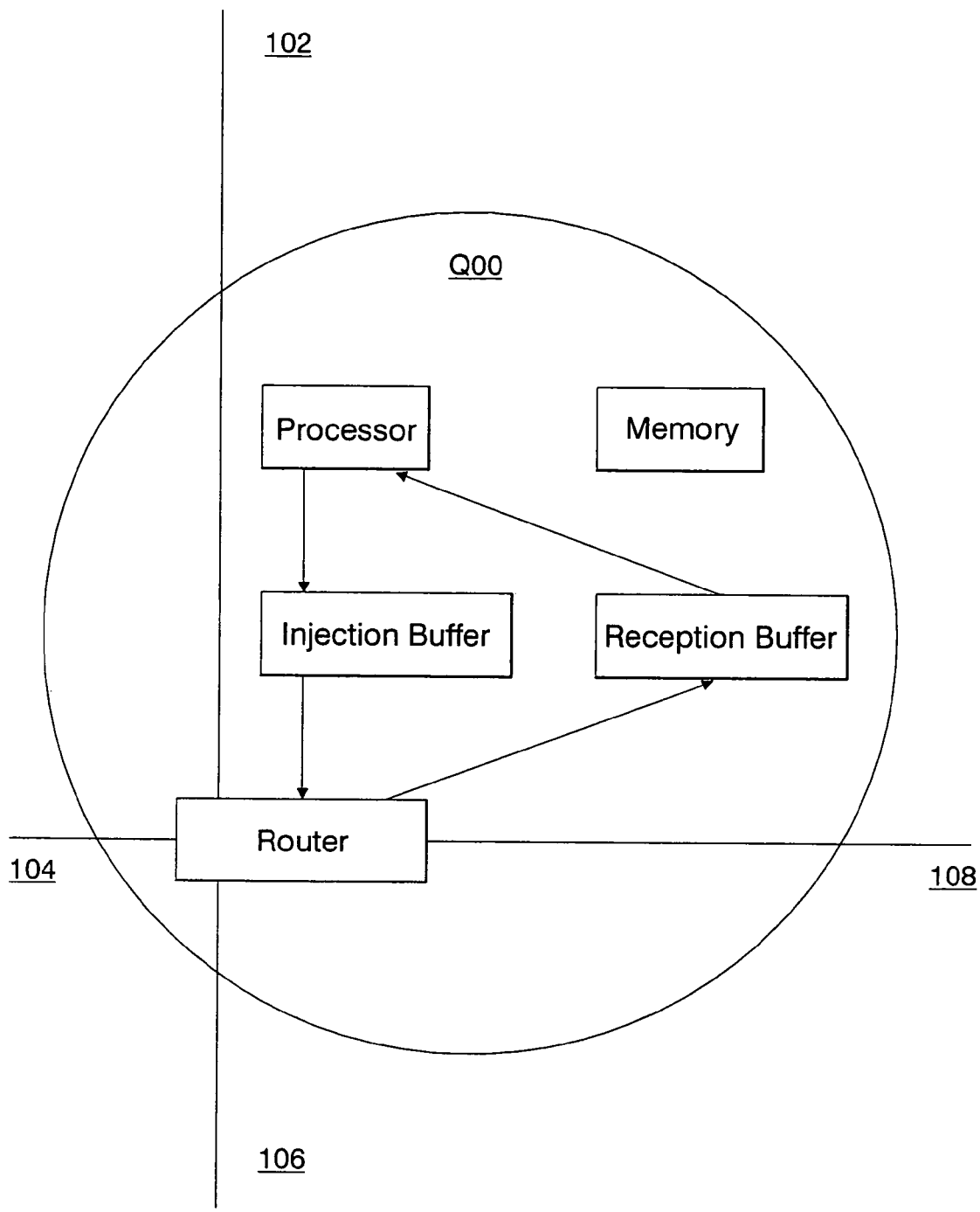
FIG. 2 illustrates in more detail an exemplary node Q00 of the nine nodes of the distributed-memory parallel supercomputer of FIG. 1.

FIG. 2 is an exemplary illustration of node Q00 of the distributed-memory parallel supercomputer of FIG. 1. The node is similar to that in provisional application Ser. No. 60/271,124. The node contains one processor which operates on local memory. The node contains a router which sends and receives packets on the grid links 102,104,106,108 connecting the node Q00 to its neighboring nodes Q20,Q02,Q10, Q01, respectively, as illustrated in FIG. 1. The node contains a reception buffer. If the router receives a packet destined for the local processor, the packet is placed into the reception buffer, from which the packet can be received by the processor. Depending on the application and the packet, the processor may write the contents of the packet into memory. The node contains an injection buffers which operates in a first-in, first-out (FIFO) manner. If the CPU places a packet into an injection FIFO, once the packet reaches the head of the FIFO, the packet is removed from the FIFO by the router and the router places the packet onto a grid link toward the destination node of the packet.

The routing implemented by the router has several simultaneous characteristics. The characteristics are some of those described in provisional application Ser. No. 60/271,124. The routing is a virtual cut-through routing. Thus if an incoming packet on one of the grid links is not destined for the processor, then the packet is forwarded by the router onto one of the outgoing links. This forwarding is performed by the router without the involvement of the processor. The routing is a shortest-path routing. For example, a packet sent by node Q00 to node Q02 will travel over the grid link 104. Any other path would be longer. For another example, a packet sent by node Q00 to node Q11 will travel over the grid links 106 and 112 or over the grid links 108 and 110. The routing is an adaptive routing. There may be a choice of grid links by which a packet can leave a node. In the previous example, the packet could leave the node Q00 via the grid link 106 or 108. For a packet leaving a node, adaptive routing allows the router to choose the less busy outgoing link for a packet or to choose the outgoing link based on some other criteria. Adaptive routing is not just performed at the: source node of a packet; adaptive routing also is performed at each intermediate node that a packet may cut through on the packet's way to the packet's destination node.

Class routing can be used to achieve a wide variety of types of message passing. Some of these types are described in the following examples which describe many details of class routing.

EXAMPLE 1

Path-based Multidrop Message Passing

The network of a distributed-memory parallel computer is an example of a message-passing data network. Each node of such a computer has one or more processors that operate on their local memory. An application using multiple nodes of such a computer coordinates their actions by passing messages between them. An example of such a computer is described in provisional application Ser. No. 60/271,124 for A Massively Parallel Supercomputer. In that computer, each single node is paired with a single switch of the network. In that computer, the switches are connected to each other as a three dimensional (3D) torus. Thus in that computer, each switch is linked to six other switches. These links are to a switch in the positive direction and to a switch in the negative direction in each of the three dimensions. Each switch is identified by its (x, y, z) logical address on the 3-dimensional torus. By contrast, in a computer using a 2-dimensional torus, each switch is identified by its (x, y) logical address. In FIG. 1, the positive X direction is towards the right, and the positive Y direction is towards the bottom. In FIG. 1, node Q00 has, the logical address (0,0), node Q01 has logical address (0,1) and so on. Since each node is paired with a single switch, a node has the address of its switch. By including a field for such a logical address in the packet header, the packet can efficiently and conveniently identify its destination node. Without class routing, the basic network only provides unicast message passing. If a switch is the destination of an incoming packet, then the packet is given to the local node. Otherwise, the packet is put onto a link towards to the destination node.

The following is an example using class routing to implement multidrop message passing. Each packet header has a field for a class value. This value is either 0 or 1. Each switch has a table used to determine if, in addition to the usual unicast routing of the packet, a copy should be deposited at the local node. This assumes for the original unicast message passing, that the processor is not involved when the router forwards a packet from one of the incoming links to one of the outgoing links. This assumption is satisfied by virtual cut-through routing, as implemented for example in provisional application Ser. No. 60/271,124. This assumes for the original unicast message passing, that the processor is not involved when the router forwards a packet from one of the incoming links to one of the outgoing links. This assumption is satisfied by virtual cut-through routing, as implemented for example in the provisional application Ser. No. 60/271,124. For the class values [0,1], the entries in this deposit table are [0,1] and demand that the packet is not deposited or deposited, respectively. The table is illustrated below. The table only applies for a packet at a node other than its destination node. A packet at its destination node is deposited as in the usual unicast routing. Thus packets with class value 0 obey the original unicast message passing. Packets with class value 1 perform path-based multidrop message passing.

| For a packet NOT destined for this node | |
|---|---|
| class value | deposit value |
| 0 | 0 |
| 1 | 1 |

Path-based multidrop message passing can be used to implement multiphase multicasting, as described for example in _D. K.Panda, S.Singal and P.Prabhakaran, "Multidestination Message Passing Mechanism Conforming to Base Wormhole Routing-Scheme", PCRCW'94, LNCS 853, Springer-Verlag, pp. 131-145, 1994_. The first example described here is a two phase multicast from node (0,0) to the 9 nodes of the 3*3 torus illustrated in FIG. 1. In the first phase, node (0,0) sends a multidrop message with destination (0,2). In the second phase, each of the 3 recipients of the first phase simultaneously send a multidrop message. Node (0,0) sends to (2,0); node (0,1) to (2,1) and node (0,2) to (2,2). At the end of the second phase, all 9 nodes of the 2-dimensional torus have received the broadcast message.

The above assumes that in the original unicast message passing, when the source node and destination node are in the same row, then the path of the packet is along that row. A row is a group of nodes which have equal values for all but one of the dimensions of the torus or mesh. The assumption is guaranteed by shortest-path routing, as implemented for example in provisional application Ser. No. 60/271,124. The above assumption also is guaranteed by the deterministic routing implemented in the provisional application. By contrast, the above assumption is not satisfied by the congestion avoidance routing implemented elsewhere, which routes a packet via some random node.

The second example described here is a three phase multicast from node (0,0,0) to the 125 nodes of the 5*5*5 cube with the corners (0,0,0) and (4,4,4). In the first phase, node (0,0,0) sends a multidrop message with destination (0,0,4). In the second phase, each of the 5 recipients of the first phase simultaneously send a multidrop message. Node (0,0,0) sends to (0,4,0); node (0,0,1) to (0,4,1) and so on. In the third phase, each of the 25 recipients of the second phase simultaneously send a multidrop message. Node (0,0,0) sends to (4,0,0); node (0,0,1) to (4,0,1) and so on. At the end of the third phase, all 125 nodes of the cube have received the broadcast message. The above example of a 3-phase multicast for the 3-dimensional cube is easily generalized as follows. For a D-phase multicast from an origin node to all nodes of a D-dimensional cube wherein, in a first phase the origin node sends a multidrop message to all other nodes in one of the rows of the sending node, in a second phase each of the recipients of the first phase and the sender of the first phase simultaneously send a multidrop message to all other nodes in a row orthogonal to the row of the first phase, in a third phase each of the recipients of the second phase and the senders of the second phase simultaneously send a multidrop message to all other nodes in a row orthogonal to the rows of the first and second phases, and so on in further phases such that all node of the cube receive the broadcast message after all the phases.

The implementation of path-based multidrop message passing using class routing offers advantages beyond existing implementations. For example, a particular existing implementation places the deposit value into the packet. In that implementation, every node on the path of the packet receives a copy of the packet. In contrast, since each switch can have different entries in its deposit table, class routing allows a node with the deposit entries [0,0] to not receive a copy of a packet, even though the node is on the path of the multidrop packet. The table is illustrated below. For example, with several class values for multicasting, this allows for several multicast groups, each with a different set of nodes.

| For a packet NOT destined for this node | |
|---|---|
| class value | deposit value |
| 0 | 0 |
| 1 | 0 |

EXAMPLE 2

Sending Multidrop Packets without Knowing the Recipients

As described in Example 1, class routing allows a node with the deposit entries [0,0] for class values [0,1 ] to not receive a copy of a packet, even though the node is on the path of the multidrop packet. This information need not be known by the source node of the multidrop packet. In other words, class routing allows a node to source a multidrop packet without knowing the recipients. However, in the network of Example 1 there is one exception, the destination node of the multidrop packet always will receive a copy of the packet. Thus if the destination node is to not receive a copy of the packet, this must be known by the source node such that it can use another destination.

For example, assume node (0,0) is the source of a multidrop packet originally destined for node (0,2). This may be a natural destination on a torus network of size 3*3, since nodes (0,9) through (0,2) are a complete row. If node (0,2) is to not receive a copy, then this must be known by node (0,0). If node (0,0) also knows that node (0,1) is to receive a copy, then (0,1) can be used as the destination of the multidrop packet.

In order to solve the exception caused by the destination node, class routing allows each switch to have an additional table which determines if a copy of a packet should be deposited at the destination node. To solve the above example, for node (0,2) the entries in. this destination table are [1,0] for the class values [0,1]. The entry 0 for class 1, causes node (0,2) to not receive multidrop messages, even if it is the destination. The entry 1 for class 0 allows node (0,2) to receive unicast messages as usual. The two tables are illustrated below.

| class value | deposit value |
|---|---|
| For a packet destined for this node (0,2) | |
| 0 | 1 |
| 1 | 0 |
| For a packet NOT destined for this node (0,2) | |
| 0 | 0 |
| 1 | 0 |

In the above example, node (0,2) is not a participant in the multicast with class value 1.

As a contrasting example, node (0,1) is a participant in the multicast with class value 1. The corresponding tables for node (0,1) are illustrated below.

|  |  |
| --- | --- |
| class value | deposit value |
| For a packet destined for this node (0,1) | |
| 0 | 1 |
| 1 | 1 |
| For a packet NOT destined for this node (0,1) | |
| 0 | 0 |
| 1 | 1 |

EXAMPLE 3

Snooping

Assume the network described above in Example 1, including its use of the class value 0 for the unicast messages of the basic network. A node can snoop, and acquire and store information on the unicast packets passing through its switch by using the entry 1 for class value 0 in the deposit table.

The table is illustrated below. In the example, the node is a participant in the multicast with class value 1. The table only applies for a packet at a node other than its destination node. In this example, a packet at its destination node is deposited as in the usual unicast routing.

| For a packet NOT destined for this node | |
| --- | --- |
| class value | deposit value |
| 0 | 1 |
| 1 | 1 |

An example use of such snooping is the investigation of the performance of the network. Without snooping there may only be information on when the packet entered the network at the source node and when it exited at the destination node. With snooping, there can be information on when the packet passed through a node on the path of the packet. Since there may be multiple valid paths between a pair of nodes, snooping also can provide information on which particular path was used. An example of a routing with multiple valid paths between a pair of nodes is adaptive routing, as implemented for example in provisional application Ser. No. 60/271,124.

Since each switch can have different entries in its deposit table, class routing allows an arbitrary number of nodes to be snooping. If only a small fraction of nodes in the network are snooping, then the measurements are a statistical sampling.

Snooping is an example use of class routing not specifically related to multicasting.

EXAMPLE 4

Single Phase Multicast

In a single phase multicast, the message is injected once into the network by one of the nodes. In contrast, in a multiphase multicast, the message is injected several times into the network, perhaps by multiple nodes. For example, in the multiphase multicast on the 3*3 node torus described above in Example 1, the message is injected a total of 1+3=4 times by 3 different nodes. For example, in the multiphase multicast on the 5*5*5 node torus described above in Example 1, the message is injected a total of 1+5+25=31 times by 25 different nodes.

As well known, to provide single phase multicast, a switch must be able to duplicate an incoming packet onto multiple outgoing links. In essence, the message duplication performed by a node in multiphase multicasting is performed by a switch in single phase multicasting.

The advantage offered by class routing for single phase multicasting is an efficient encoding and decoding of which of the outgoing switches do or do not receive a copy of a particular incoming packet. After a simple example describing the encoding and decoding scheme offered by class routing, the scheme is compared to existing schemes.

The first example described here is the same multicast described in Example 1 from node (0,0) to the 9 nodes of the 3*3 torus illustrated in FIG. 1. In Example 1 it is a two phase multicast; here it is a single phase multicast. Here the pattern of messages across the network is chosen to be similar to that of Example 1.

Each packet header has a field for a class value. This value is either 0 or 1. Each switch has a table used to determine if the usual unicast routing of the packet is to be performed or if the actions of single phase multicast routing are to be performed. Each entry in the table is a bit string of the format UDXY. If in a table entry U is 1, then the usual unicast routing is to be performed, otherwise not. If D is 1, then a copy of the packet is to be deposited at the local node, otherwise not. If X is 1, then a copy of the packet is to go out the positive X link, otherwise not. If Y is 1, then a copy of the packet is to go out the positive Y link, otherwise not. The two links in the negative X and Y direction are irrelevant to the example and are ignored here for simplicity.

For class value 0, the entry in the table is 1000 on all nodes. Thus packets with class value 0 obey the original unicast message passing. For class value 1, the entry in the table depends on the location of the switch in the network. The entry at each switch mimics the actions of the corresponding node in the multiphase multicast of Example 1.

At each node, the table is obeyed for all packets entering the node. If a packet has class value 0, then the UDXY=1000 identifies the packet as a unicast packet and only then is the destination of the packet examined.

For class value 1, switch (0,0) has the entry 0011. This assumes that the source node of the multicast does not need another copy. The table for node (0,0) is illustrated below.

| For a packet at node (0,0) | |
| --- | --- |
| class value | UDXY value |
| 0 | 1000 |
| 1 | 0011 |

Continuing with class value 1 for the other switches in the 3*3 torus, the switch (0,1) has the entry 0111. The four switches (0,2), (1,0), (1,1), and (1,2)-have the entry 0101. The three switches (2,0), (2,1) and (2,2) have the entry 0100. The above is a complete encoding of the information required for the example multicast using class 1. In short, packets with class value 0 obey the original unicast message passing. Packets originating from node (0,0) with class value 1 perform single phase multicast routing.

Figure 3:
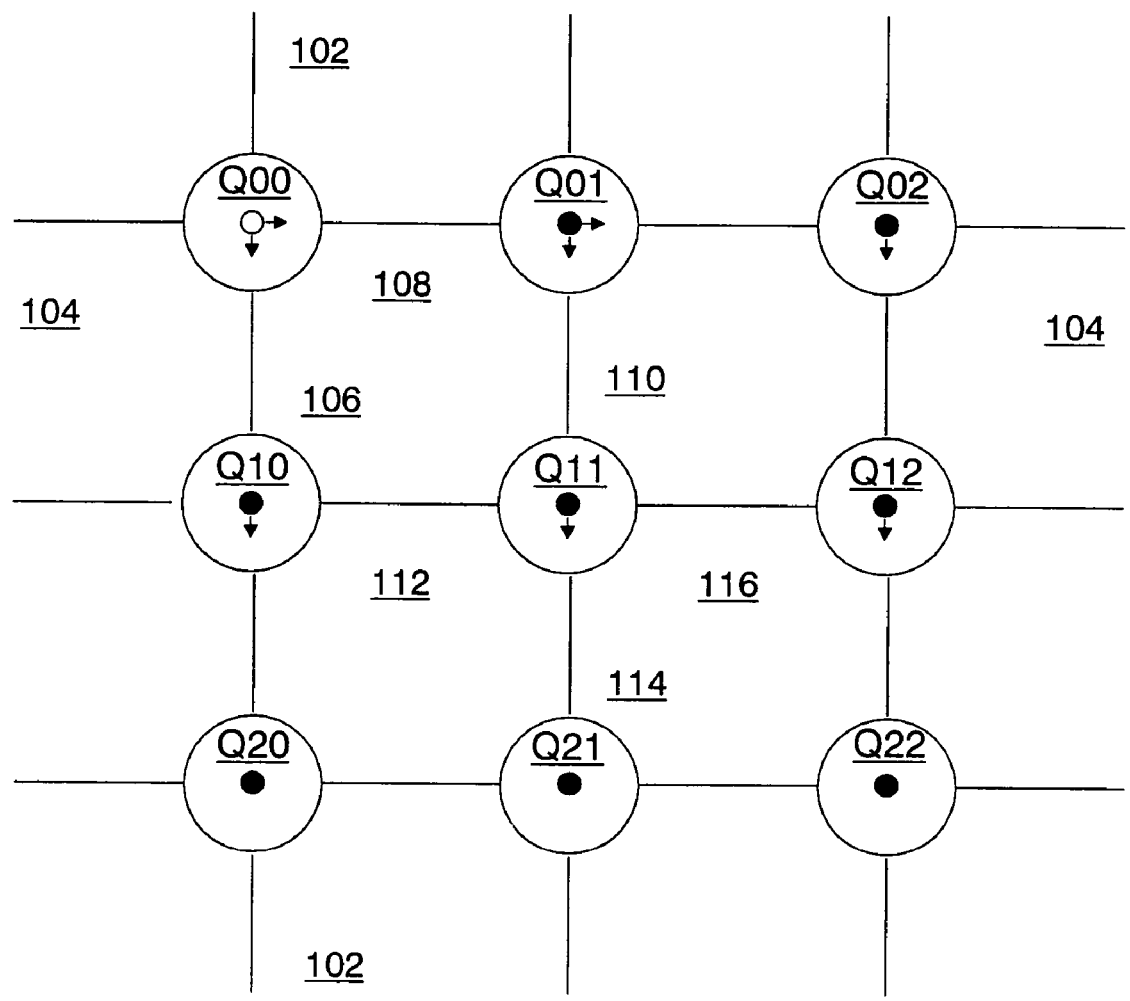
FIG. 3 illustrates an exemplary single phase multicast from node Q00 to the other 8 nodes of the distributed-memory parallel supercomputer illustrated in FIG. 1.

The above UDXY values at each node for multicast from node (0,0) using class 1 is illustrated in FIG. 3. At each node, the circle is open if D=0, that is, if no copy of the packet is to be deposited at the node. At each node, the circle is closed if D=1, that is, if a copy of the packet is to be deposited at the node. At each node, there is an arrow in the positive X direction, if X=1, that is, if a copy of the packet is to go out the positive X link. At each node, there is an arrow in the positive Y direction, if Y=1, that is, if a copy of the packet is to go out the positive Y link.

The second example described here is the same multicast described in Example 1 from node (0,0,0) to the 125 nodes of the 5*5*5 cube with the corners (0,0,0) and (4,4,4). In Example 1 it is a three phase multicast; here it is a single phase multicast. Here the pattern of messages across the network is chosen to be similar to that of example 1.

Each packet header has a field for a class value. This value is either 0 or 1. Each switch has a table used to determine if the usual unicast routing of the packet is to be performed or if the actions of single phase multicast routing is to be performed. Each entry in the table is a bit string of the format UDXYZ. If in a table entry U is 1, then the usual unicast routing is to be performed, otherwise not. If D is 1, then a copy of the packet is to be deposited at the local node, otherwise not. If X is 1, then a copy of the packet is to go out the positive X link, otherwise not. Similar for the bits Y and Z. The three links in the negative X, Y and Z direction are irrelevant to the example and are ignored here for simplicity.

For class value 0, the entry in the table is 10000 on all nodes. Thus packets with class value 0 obey the original unicast message passing. For class value 1, the entry in the table depends on the location of the switch in the network. The entry at each switch mimics the actions of the corresponding node in the multiphase multicast of Example 1.

For class value 1, switch (0,0,0) has the entry 00111. This assumes that the source node of the multicast does not need another copy. The three switches (0,0,1) through (0,0,3) have the entry 01111. Switch (0,0,4) has the entry 01110. The fifteen switches in the x=0 plane with the corners (0,1,0), (0,1,4), (0,3,0) and (0,3,4) have the entry 01110. The five switches (0,4,0) through (0,4,4) have the entry 01100. The 75 switches of the cube with the corners (1,0,0), (1,0,4), (3,0,0) and (3,0,4) have the entry 01100. The 25 switches in the x=4 plane with the corners (4,0,0), (4,0,4), (4,4,0) and (4,4,4) have the entry 01000. The above is a complete encoding of the information required for the example multicast using class 1. In short, packets with class value 0 obey the original unicast message passing. Packets originating from node (0,0,0) with class value 1 perform single phase multicast routing.

In the above example of class routing for single phase multicasting, the UDXYZ bit string determines onto which output ports a packet is to be duplicated. A similar bit string is used in some existing implementations of single phase multicasting. An example is described in _R.Sivaram, R.Kesavan, D. K.Panda, C. B.Stunkel, "Architectural Support for Efficient Multicasting in Irregular Networks", IEEE Trans. On Par. And Dist. Systems, Vol. 12, No. 5, May 2001_. Another example is described in _U.S. Pat. No. 5,333,279: Self-timed mesh routing chip with data broadcasting, D.Dunning_. In these existing implementations, a bit string similar to the above UDXYZ for each switch is in the packet header. In contrast, in the above class routing implementation, the packet header merely contains the class value which is used at each switch to look up in a table the UDXYZ entry.

The above class routing implementation of single-phase multicasting is in some ways less general than these existing implementations, but the class routing is in some ways more efficient. For example, in the packet header, a field for a class value is much smaller than a field for a bit string for each switch. In the above example, the class value is 0 or 1 and thus can be stored in a one-bit field in the header. In contrast, the above UDXYZ bit string would require a five-bit field in the header. Moreover, several fields for UDXYZ values would be required, since different switches have different values for UDXYZ. The smaller field in the header is more efficient since it consumes less of the physical bandwidth of the torus network, leaving more bandwidth for the application data. The smaller field also allows for a smaller latency, since typically at a switch, the entire header must be received and checked for errors, before the packet can be forwarded.

EXAMPLE 5

Single Phase Multicast from Any Node in the Network

The single phase multicast using class routing described in Example 4 allows a single. node to be the source of the message. In the example on the 2-dimensional 3*3 torus, the source is the node (0,0). In the example on the 3-dimensional 5*5*5 torus, the source is the node (0,0,0). We'll name this a heterogeneous single phase multicast, since the class routing table has different values at different nodes. The table only is used for one of the input links.

Class routing also can be used to implement a single phase multicast where the source can be any node in the network. We'll name this a homogenous single phase multicast, since on a homogeneous network such as a torus the class routing tables have the same value on every node. On a single node, the class routing tables have different values on the different incoming links.

The first example described here is the same multicast described in Example 4 from node (0,0) to the 9 nodes of the 3*3 torus illustrated in FIG. 1. In Example 4 it is a heterogeneous single phase multicast; here it is a homogenous single phase multicast. Here the pattern of messages across the network-is chosen to be similar to that of example 4.

In the heterogeneous single phase multicast of example 4, a packet arriving at a node via any of the incoming links uses the same table to determine the actions to be performed by the switch on the packet based on the class value. As demonstrated in example 4, for the heterogeneous multicast, different nodes have different values in the table. By contrast, in the homogenous single phase multicast of this example, each incoming link on each switch has a table used to determine the actions to be performed on an incoming packet. As demonstrated below, for the homogeneous multicast, different nodes have the same values in the tables.

Each packet header has a field for a class value. This value is either 0 or 1. Each incoming link on each switch has a table used to determine if the usual unicast routing of the packet is to be performed or if the actions of single phase multicast routing is to be performed. Each entry in the table is a bit string of the format UDXY. If in a table entry U is 1, then the usual unicast routing is to be performed, otherwise not. If D is 1, then a copy of the packet is to be deposited at the local node, otherwise not. If X is 1 and the X-destination of the packet is not the X-location of the node, then a copy of the packet is to go out the positive X link, otherwise not. If Y is 1 and the Y-destination of the packet is not the Y-location of the node, then a copy of the packet is to go out the positive Y link, otherwise not. For each node, the two-outgoing links in the negative X and Y directions are irrelevant to the example and are ignored here for simplicity. For each node, the two incoming. links in the negative X and Y directions are irrelevant to the example and are ignored here for simplicity.

As described above, the X-destination and the Y-destination of the packet are determined in order to determine the actions performed on the packet. Thus for node (0,0) to broadcast to all other 8 nodes of the 3*3 torus, the packet must have the destination (3,3).

In general for a broadcast in this example, the destination of the packet is the furthest node in the positive X and positive Y direction from the source of the broadcast. For example, for node (1,0) to broadcast to all other 8 nodes of the 3*3 torus, the packet must have the destination (0,2).

For class value 0, the entry in the table is 1000 on all tables on all nodes. Thus packets with class value 0 obey the original unicast message passing. For class value 1, the entry in the table depends on which incoming link the packet arrived on. The tables are illustrated below. The entry for each incoming link are such that the resulting homogeneous multicast mimics the heterogeneous multicast of Example 4.

| class value | UDXY value |
| --- | --- |
| For a packet incoming on the link from the negative x direction | |
| 0 | 1000 |
| 1 | 0111 |
| For a packet incoming on the link from the negative y direction | |
| 0 | 1000 |
| 1 | 0011 |

The above is a complete encoding of the information required for the example multicast using class 1. In short, packets with class value 0 obey the original unicast message passing. Packets with class value 1 perform a homogeneous single phase multicast routing.

Given the above 2-dimensional torus example, the technique is easily extended to other networks. Class 1 in the above example can be considered to provide multicasting in the positive X and positive Y quadrant of a mesh. Three additional similar classes 2, 3 and 4 could provide multicasting in the other three quadrants: negative X and positive Y; positive X and negative Y; as well as negative X and negative Y. These four classes allow any node in the mesh to use four multicasts to effectively broadcast a packet to all other nodes in the mesh. Using the same broadcast technique on the torus would be twice as fast as the single class technique described above. It is twice as fast since the distance between the source node and the destination nodes is halved. This technique is feasible since any node on a torus can be treated as a node in the middle of a mesh.

The above technique is easily generalized to a mesh or torus of D dimensions. On a D dimensional mesh or torus, 2*D classes allow any node in the mesh or torus to use 2*D multicasts to effectively broadcast a packet to all other nodes in the mesh or torus. On the torus, the alternative single broadcast to all the nodes will require twice as long to complete as the 2*D multicasts on the torus since the distance between the source node and the furthest destination is double for the single broadcast.

Enhancements and Alternatives to Class Tables

Instead of or in addition to using tables on the switch, the class value and perhaps other characteristics of the packet can be input to an algorithm. If table entries are the same for all class values, then it might be better to use a algorithm If a switch needs to decide between conflicting actions demanded by tables, as which can be programmed with the relative priorities of different tables.

Using Class-based Multicasting to Create other Classes

In Example 5, class value 0 is used for the usual unicast, while class value 1 can be used to broadcast to all nodes in the torus. Having established a broadcast mechanism, it can be used to broadcast any data. For example, this data could be the class table entries for other classes. For example, Example 5 identified a need for the additional classes 2,3 and 4. Once multicasting on class 1 is established by whatever means, class 1 can be used to create classes 2,3 and 4. In general, once communication on a particular class value or values is established, that communication can be used to establish communication on other class values.

EXAMPLE 7

Dense Matrix Calculation Using Class Function

The present invention also uses the class function on a torus computer network to do dense matrix calculations. By using the hardware implemented class function on the torus computer network it is possible to do high performance dense matrix calculations.

Class function is the name used in this example for multicasting based on class network routing. Often, the multicast is to other nodes in the same row. So often it is sufficient for class routing-to implement a single phase of path-based multidrop message passing, which is described in Example 1. When the multicast is not to a row, it is to a plane, cube or other higher dimension subset of the torus or mesh. In this case, optimal performance demands that class routing implement a more sophisticated multicast, such as the single phase multicast described in Example 5.

The present invention makes dense matrix inversion algorithms on distributed memory parallel supercomputers with hardware class function capability perform faster. This is achieved by exploiting the fact that the communication patterns of dense matrix inversion can be served by hardware class functions. This results in faster execution times.

The algorithms as discussed herein are well known in the art, and are discussed, for example, in NUMERICAL RECIPES IN FORTRAN, THE ART OF SCIENTIFIC COMPUTING, Second Edition, by William H. Press, et al., particularly at page 27 et. seq.

Figure 4:
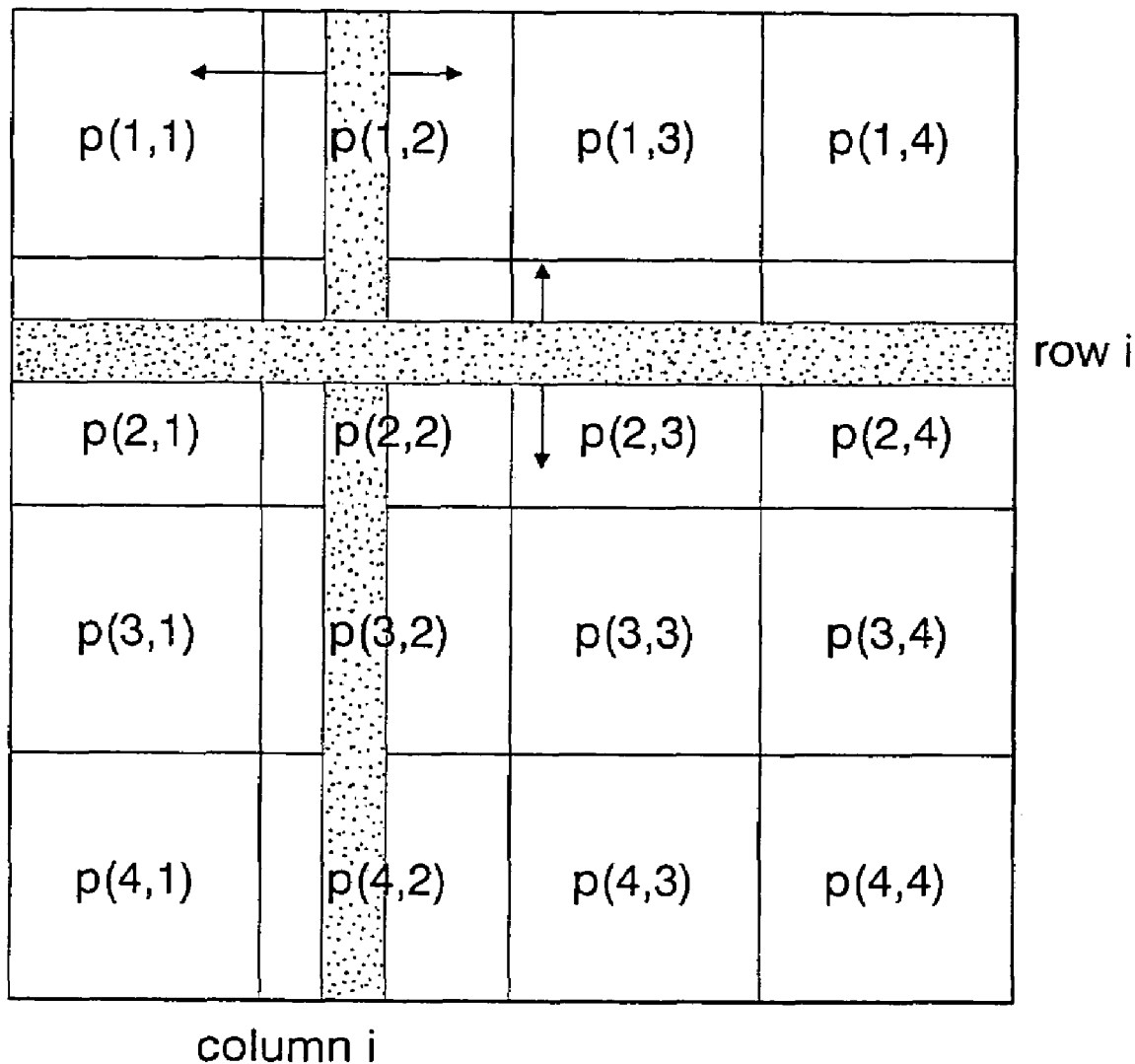
FIG. 4 illustrates a 4×4 grid of processors wherein each processor is labeled by its row, column numerals.

FIG. 4 illustrates a 4×4 grid of processors wherein each processor is labeled by its row, column numerals. For example the processor in row 2 column 3 is p (2,3). The column i and row i are also shown (shaded areas) as well as the directions that the column/row has to be sent via the class function.

One can invert a dense linear matrix using standard algorithms such as Gauss-Jordan elimination as well as other methods. In general the I/O required is of a special one-to-many variety that is well suited to the communication functionality of a parallel supercomputer with hardware class function capability. One can utilize the class functionality to multicast data to an entire row or surface of the machine.

Some of the terms used in the description of this invention are explained below:

The Gauss-Jordan Algorithm:

The kernel of the Gauss-Jordan algorithm without pivoting is given below. Initially b is an identity matrix and a is the matrix whose inverse is being computed.

```
do i=1,N
    do j=i,N
        do k=1,N; (k not equal to i)
            b(k,j) = b(k,j) - [a(k,i) / a(i,i)] * b(i,j)
            a(k,j) = a(k,j) - [a(k,i) / a(i,i)] * a(i,j)
        enddo
    enddo
enddo
```

Equation 1

Distributed Memory Parallel Supercomputer:

Such a computer consists of many nodes. Each node has one or more processors that operate-on local memory. The nodes are typically connected as a d-dimensional grid and they communicate via the grid links. If the grid is 2-dimensional with P×P processors then an N×N matrix can be partitioned so that L×L pieces of it reside on each node (L=N/P). If the machine is not connected as a 2-dimensional grid the problem can always be mapped onto it by appropriately "folding" the matrix onto the grid. Without loss of generality and in order to make the presentation of this invention simple the processor grid will be assumed to be 2-dimensional.

Hardware Class Functions:

Class functions are a hardware implementation of multicast. Suppose that processor p(1,1) (here the numerals indicate the position of the processor on the grid, also see FIG. 4) wants to send the same packet of data to processors p(1,2), p(1,3) and p(1,4). Typically this is done by first sending the data to processor p(1,2). Once the data arrives into p(1,2) software routines read it and store it in memory. Then p(1,2), reads the data from memory and sends it to p(1,3) etc. The problem with this is that it takes a long time to fully receive the packet of data into memory and then resend it. If the hardware was built so that the packet of data that arrived into p(1,2) was simultaneously stored into the p(1,2) memory and immediately sent to p(1,3) then. the delay would be greatly reduced. The hardware function of p(1,1) sending a packet of data to p(1,4) while that packet is deposited into the memory of the intermediate processors that it goes through is called the hardware class function.

The Invention:

This invention exploits the fact that the communication patterns of dense matrix inversion (for example-using the Gauss-Jordan method) can utilize class functions. This can be seen from equation 1 that describes the Gauss-Jordan algorithm:

The a(i,i) are communicated via some other method, for example a global broadcast. Then the right hand side of the equations for b(k,j) and a(k,j) involve elements that have only one index different from (k,j) but not both (a(k,i), a(i,j) and b(i,j)). Class function communication can be used to send such elements across the relevant processors.

For example, in order to calculate b(k,j) for a given row k (1<j<N) one needs a(k,i) to be known for all processors that contain the row k. Therefore, one must send a(k,i) along the row of processors that contain the matrix row k. This can be done using the class functionality. As already discussed this results in large reductions in total communication time.

This completes the description of the idea for this invention. The idea was described for the Gauss-Jordan algorithm but it is not specific to it. For example this idea applies to the "Gauss-Jordan with Pivoting", "Gaussian Elimination with Back Substitution" and "LU Decomposition" algorithms.

An implementation of this idea (using the Gauss-Jordan algorithm) with all the details is presented below as an example. In order to make the example easy to understand the simplest implementation was chosen. More complex implementations that result in communications involving larger data packets have also been worked out. Depending on the size of the processor grid and the size of the matrix larger packet sizes may be desirable since they further improve performance by minimizing latency. However, this does not affect the premise of this idea.

An Example Algorithm:

The Gauss-Jordan algorithm is used to find the matrix inverse of a dense matrix of size N×N uniformly spread out on a grid of P×P nodes. Therefore each node has an L×L piece of the matrix in its memory (L=N/P). A hardware class function is used to multicast data across rows and columns. For a visual picture of this algorithm-please refer to FIG. 1 above.

For each 1<i<N

1) Using class functions send to the left and right the column i of a's (a(k,i), 1<k<N)
2) Scale the elements a, b of row i by a(i,i)
3) Using class functions send up and down the new row i of a's and b's (a(i,j) and b(i,j), 1<j<N)
4) Now all processors have the necessary elements to do the standard Gauss-Jordan step for column i. At the end of this column i is the same as column of the identity matrix.

Repeat

End of Examples:

While several embodiments and variations of the present invention for class networking routing are described in detail herein, it should be apparent that the disclosure and teachings of the present invention will suggest many alternative designs to those skilled in the art.

Having thus described our invention, what we claim as new and desire to secure by Letters Patent is:

1. A method of class network routing in a network to allow a compute processor in a network of compute processors located at nodes of the network to multicast a message to a plurality of other compute processors in the network comprising:

dividing, a message into one or more message packets which pass through the network, each one or more message packets including a header having a field including a class value;

at each switch in the network, using the class value as a vector index to a table having an array of stored values that efficiently encode actions performed by the switch on the message packet, said class value determining a switch action of path-based multidrop message passing for multiphase multicasting of a message packet through the network along a path comprising an intermediate node and a destination node, to determine from said table having an array of stored values at a switch at each said intermediate node or destination node, whether that intermediate node or a destination node should deposit a copy of the message packet, wherein said array of stored values at each switch includes different entries such that said class network routing allows a node to not receive a copy of a packet, even though the node is on a path of the multidrop message packet, wherein said class network routing further comprising using a D-phase multicast from an origin node to all nodes of a D-dimensional cube wherein, in a first phase the origin node sends a multidrop message to all other nodes in one of the rows of the sending node, in a second phase each of the recipients of the first phase and the sender of the first phase simultaneously send a multidrop message to all other nodes in a row orthogonal to the row of the first phase, in a third phase each of the recipients of the second phase and the senders of the second phase simultaneously send a multidrop message to all other nodes in a row orthogonal to the rows of the first and second phases, and so on in further phases such that all node of the cube receive the broadcast message after all the phases.

2. The method of claim 1, including:
providing a class value to implement multidrop message passing;
providing each switch with a first table to determine if a copy of the message packet is to be deposited at a local node if said local node is an intermediate node, and a second table to determine if a copy of the message packet is to be deposited at a local node if said local node is a destination node.

3. The method of claim 1, including providing a class value determining a switch action of multidestination message passing of a message packet to multiple destination nodes in the network, wherein, for each incoming packet at a local node, said class value is used as an index into a table having entry values indicating if packet should be routed using other information in the table entry.

4. The method of claim 1, wherein a table entry is made up of multiple bits for encoding all routing actions, one or more said bits corresponding to one or more outgoing links from said switch, said switch duplicating an incoming packet onto multiple outgoing links.

5. The method of claim 4, including providing a class routing table with different values on different incoming links.

6. The method of claim 4, wherein the message packet is multicast to an entire row, plane, cube or other collection of contiguous nodes on the network.

7. The method of claim 4, for a D-dimensional network, including providing 2*D class values for multicast in each of the 2*D directions to allow each node in the network to use 2*D multicasts to effectively broadcast a packet to all other nodes in the mesh.

8. The method of claim 1, including:
performing dense matrix inversion algorithms on a network of distributed memory parallel computers with hardware class function multicast capability, wherein the hardware class function multicast capability simultaneously stores into memory a message packet that arrives and immediately sends the message packet to one or more other nodes while that message packet is being stored into memory, such that the communication patterns of the dense matrix inversion algorithms are served by the hardware class function multicast capability to minimize communication delays.

9. The method of claim 1, wherein the network comprises a network of distributed-memory parallel computers;
providing each node of the computer network with one or more processors that operate on local memory;
coordinating the actions of multiple nodes of the computer by using class routing to pass messages between the multiple nodes.

10. The method of claim 9, including:
pairing each node with a switch of the network;
connecting the switches to form a three dimensional toms wherein each switch is 1 inked to six other switches, the links are coupled to a switch in a positive direction and also to a switch in a negative direction in each of the three dimensions;
identifying each switch by an x, y, z logical address on the toms, wherein each node has the address of its switch;
including a field value for the logical address in the packet header, to enable the packet to identify a destination node.

11. The method of claim 1, including providing a class value determining a switch action of a unicast of a message packet through the network to a single destination node.

12. The method of claim 1, including providing a class value enabling a node to perform snooping, wherein a node acquires and stores a copy of all packets passing through the node, including packets not destined nor deposited at the node to provide information on the performance of the network.

13. The method of claim 1, including providing class values to determine if a copy of the message packet is to go out on an X link or not, and out on a Y link or not, and out on a Z link or not and so on for the other links of the D dimensions.

14. The method of claim 1, including providing different tables and providing priorities for different tables to enable a switch to decide between conflicting actions indicated by different tables.

15. The method of claim 1, including using class-based multicasting to create other classes, such that the contents of a table for a particular class value is determined by using another class value.

16. The method of claim 1, wherein said array of stored values at each switch includes several class values for multicasting such that said class network routing allows for several multicast groups, each with a different set of nodes.

* * * * *

UNITED STATES PATENT AND TRADEMARK OFFICE
CERTIFICATE OF CORRECTION

| | | |
|---|---|---|
| PATENT NO. | : 7,587,516 B2 | Page 1 of 1 |
| APPLICATION NO. | : 10/468999 | |
| DATED | : September 8, 2009 | |
| INVENTOR(S) | : Bhanot et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1222 days.

Signed and Sealed this

Twenty-first Day of September, 2010

David J. Kappos
*Director of the United States Patent and Trademark Office*